(12) United States Patent
Cho et al.

(10) Patent No.: US 10,840,276 B2
(45) Date of Patent: Nov. 17, 2020

(54) DISPLAY PANEL AND METHOD FOR MANUFACTURING THE SAME

(71) Applicants: HKC CORPORATION LIMITED, Shenzhen (CN); CHONGQING HKC OPTOELECTRONICS TECHNOLOGY CO., LTD., Chongqing (CN)

(72) Inventors: En-Tsung Cho, Chongqing (CN); Fengyun Yang, Chongqing (CN)

(73) Assignee: HKC CORPORATION LIMITED CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/328,787

(22) PCT Filed: Nov. 28, 2018

(86) PCT No.: PCT/CN2018/117990
§ 371 (c)(1),
(2) Date: Feb. 27, 2019

(87) PCT Pub. No.: WO2020/073448
PCT Pub. Date: Apr. 16, 2020

(65) Prior Publication Data
US 2020/0111819 A1    Apr. 9, 2020

(30) Foreign Application Priority Data
Oct. 8, 2018   (CN) .......................... 2018 1 1169412

(51) Int. Cl.
*H01L 27/146* (2006.01)
*H01L 27/12* (2006.01)
*H01L 27/15* (2006.01)

(52) U.S. Cl.
CPC ........ *H01L 27/1288* (2013.01); *H01L 27/127* (2013.01); *H01L 27/1461* (2013.01);
(Continued)

(58) Field of Classification Search
None
See application file for complete search history.

(56) References Cited

U.S. PATENT DOCUMENTS

2008/0224143 A1   9/2008   Kim et al.
2009/0032824 A1*  2/2009   Suzumura ............... G09G 3/20
                                                              257/84
(Continued)

FOREIGN PATENT DOCUMENTS

CN    1340847 A      3/2002
CN    102751302 A   10/2012
(Continued)

OTHER PUBLICATIONS

International Search Report from International Application No. PCT/CN2018/117990 dated Jun. 21, 2019.

*Primary Examiner* — Benjamin P Sandvik
(74) *Attorney, Agent, or Firm* — Dorsey & Whitney LLP (57) ABSTRACT

The present application provides a display panel and a method for manufacturing the same. The method includes: forming a groove right above a gate electrode and a first through hole above a substrate on a photoresist layer by using a halftone photomask with multi-transmittance and dividing the photoresist layer into a first region and a second region through the first through hole.

20 Claims, 5 Drawing Sheets

(52) U.S. Cl.
CPC .. *H01L 27/14612* (2013.01); *H01L 27/14643* (2013.01); *H01L 27/156* (2013.01)

(56) References Cited

U.S. PATENT DOCUMENTS

| | | | | |
|---|---|---|---|---|
| 2010/0201664 | A1* | 8/2010 | Lee | H01L 27/288 345/207 |
| 2015/0179869 | A1* | 6/2015 | Xie | H01L 31/03762 257/53 |
| 2016/0365381 | A1* | 12/2016 | Zhao | H01L 27/14692 |
| 2018/0329246 | A1* | 11/2018 | Cho | G02F 1/1368 |

FOREIGN PATENT DOCUMENTS

| | | |
|---|---|---|
| CN | 104900669 A | 9/2015 |
| CN | 105336751 A | 2/2016 |
| CN | 107300812 A | 10/2017 |
| JP | 2008282844 A | 11/2008 |
| KR | 20060127498 A | 12/2006 |

* cited by examiner

DISPLAY PANEL AND METHOD FOR MANUFACTURING THE SAME

TECHNICAL FIELD

The present application relates to the field of electronic technologies and in particular, to a display panel and a method for manufacturing the same.

BACKGROUND

In today's society, display panels are everywhere. Televisions, computers, smartphones, and the like are all supported by the display panels. In a display panel, manufacturing of a thin film transistor and manufacturing of a photodiode both use corresponding photomask processings. However, manufacturing of a photomask costs much time and much money. Therefore, how to reduce the number of photomasks and reduce processing costs is always a technical problem that needs to be urgently resolved by a person skilled in the art.

SUMMARY

In view of this, embodiments of the present application provide a display panel and a method for manufacturing the same, which is capable of reducing the number of photomasks and reducing the processing costs.

According to one aspect, a method for manufacturing a display panel is provided according to an embodiment of the present application. The method includes:

providing a substrate and forming a gate electrode on the substrate;

covering a gate insulating layer, a semiconductor layer, a contact layer, a second metal layer, and a photodiode layer on the gate electrode sequentially and covering a photoresist layer on a surface of the photodiode layer;

forming a groove located right above the gate electrode and a first through hole located above a middle region of the substrate on the photoresist layer through a halftone photomask with multi-transmittance M and dividing the photoresist layer into a first region on one side of the gate electrode and a second region on the other side of the gate electrode through the first through hole;

etching a region uncovered by the photoresist layer until the gate insulating layer is exposed;

perforating the groove to form a second through hole that exposes the photodiode layer;

etching at the second through hole until the semiconductor layer is exposed, to form a source electrode and a drain electrode that are in contact with the semiconductor layer through the contact layer;

removing the remaining photoresist layer of the first region and the photodiode layer of the first region;

removing the photoresist layer of the second region and covering a passivation layer on a surface exposed above the substrate;

forming a first electrode via corresponding to the drain electrode and a second electrode via corresponding to the photodiode layer on a surface of the passivation layer; and forming pixel electrodes at the first electrode via and the second electrode via.

In some embodiments, the providing a substrate and forming a gate electrode on the substrate includes:

covering a first metal layer on the substrate and etching the first metal layer through a first photomask to form the gate electrode.

In some embodiments, the perforating the groove to form a second through hole that exposes the photodiode layer includes:

processing the photoresist layer on a surface of the first region through the halftone photomask with multi-transmittance M, so that the groove is perforated to form the second through hole that exposes the photodiode layer.

In some embodiments, the forming a groove located right above the gate electrode and a first through hole located above a middle region of the substrate on the photoresist layer through a halftone photomask with multi-transmittance M includes:

removing an edge portion of the photoresist layer.

In some embodiments, transmittances of the halftone photomask with multi-transmittance M linearly change at each position at which regions having different transmittances are connected.

In some embodiments, a photodiode of the photodiode layer is a P-I-N junction photodiode.

According to another aspect, a method for manufacturing a display panel is provided according to an embodiment of the present application. The method includes:

covering a first metal layer on the substrate and etching the first metal layer through a first photomask to form a gate electrode;

covering a gate insulating layer, a semiconductor layer, a contact layer, a second metal layer, and a photodiode layer on the gate electrode sequentially and covering a photoresist layer on a surface of the photodiode layer;

forming a groove located right above the gate electrode and a first through hole located above a middle region of the substrate on the photoresist layer through a halftone photomask with multi-transmittance, removing an edge portion of the photoresist layer, and dividing the photoresist layer into a first region on one side of the gate electrode and a second region on the other side of the gate electrode through the first through hole;

etching a region uncovered by the photoresist layer until the gate insulating layer is exposed;

processing the photoresist layer on a surface of the first region through the halftone photomask with multi-transmittance, so that the groove is perforated to form a second through hole that exposes the photodiode layer;

etching at the second through hole until the semiconductor layer is exposed, to form a source electrode and a drain electrode that are in contact with the semiconductor layer through the contact layer;

removing the remaining photoresist layer of the first region and the photodiode layer of the first region;

removing the photoresist layer of the second region and covering a passivation layer on a surface exposed above the substrate;

forming a first electrode via corresponding to the drain electrode and a second electrode via corresponding to the photodiode layer on a surface of the passivation layer; and covering, on the surface of the passivation layer, a transparent electrode layer that passes through the first electrode via and the second electrode via to respectively come into contact with the drain electrode and the photodiode layer and etching the transparent electrode layer through a fourth photomask to form pixel electrodes, wherein transmittances of the halftone photomask with multi-transmittance linearly change at each position at which regions having different transmittances are connected.

In some embodiments, the halftone photomask with multi-transmittance M is divided into seven regions M1 to M7, the seven regions are sequentially arranged according to a sequence from M1 to M7, the M1 region and the M5 region are totally transmissive, the M2 region, the M3 region, and the M4 region have certain transmittances, a transmittance of the M3 region is greater than transmittances of the M2 region and the M4 region, a transmittance of the M2 region is the same as that of the M4 region, and a transmittance of the M6 region is zero.

According to another aspect, a display panel is provided according to an embodiment of the present application. The display panel includes:

a substrate;

a gate electrode, located on a surface of the substrate, wherein a gate insulating layer covers the gate electrode;

a semiconductor layer, located on the gate insulating layer and comprising a first region semiconductor layer of a first region located above the gate electrode and a second region semiconductor layer of a second region located spaced from the first region;

a contact layer, located on the semiconductor layer of the first region and the second region, wherein a contact layer of the first region is divided into a source contact layer in contact with an upper surface source electrode and a drain contact layer in contact with an upper surface drain electrode, the source electrode and the drain electrode are in contact with the semiconductor layer respectively through the source contact layer and the drain contact layer, and a second metal layer and a photodiode layer are sequentially covered above a contact layer of the second region;

a passivation layer, covering all exposed surfaces above the substrate, wherein a surface of the passivation layer is provided with vias leading to the drain electrode and the photodiode layer; and pixel electrodes, covering the surface of the passivation layer and connected to the drain electrode and the photodiode layer through the vias.

In the method for manufacturing a display panel of the embodiments of the present application, the photoresist layer is divided into the first region on one side of the gate electrode and the second region on the other side of the gate electrode by using the halftone photomask with multi-transmittance, and a photomask in a photodiode array processing is fused with a second photomask in a manufacturing processing of the display panel, thereby reducing the number of the photomasks and reducing the processing costs.

BRIEF DESCRIPTION OF THE DRAWINGS

To illustrate the technical solutions according to the embodiments of the present application more clearly, the accompanying drawings required for describing the embodiments are introduced briefly below. Apparently, the accompanying drawings in the following description are only some embodiments of the present application, and a person of ordinary skill in the art can derive other drawings from the accompanying drawings without creative efforts.

LIST OF REFERENCE NUMERALS

10 Display panel
100 Substrate
110 First region
120 Second region
20 First metal layer
200 Gate electrode
300 Gate insulating layer
400 Semiconductor layer
500 Contact layer
600 Second metal layer
610 Source electrode
620 Drain electrode
700 Photodiode layer
800 Photoresist layer
810 Groove
820 First through hole
830 Second through hole
900 Passivation layer
910 First electrode via
920 Second electrode via
999 Pixel electrode

DETAILED DESCRIPTION OF THE EMBODIMENTS

The technical solutions in the embodiments of the present application will be describe clearly and completely below with reference to the accompanying drawings in the embodiments of the present application. Apparently, the described embodiments are some but not all of the embodiments of the present application. All other embodiments obtained by a person of ordinary skill in the art based on the embodiments of the present application without creative efforts shall fall within the protection scope of the present application.

It should be understood that the terms "include" and "comprise", when used in this specification and the appended claims, indicate the presence of described features, integers, steps, operations, elements, and/or components, but do not preclude the presence or addition of one or more other features, integers, steps, operations, elements, components, and/or groups thereof.

Figure 1:
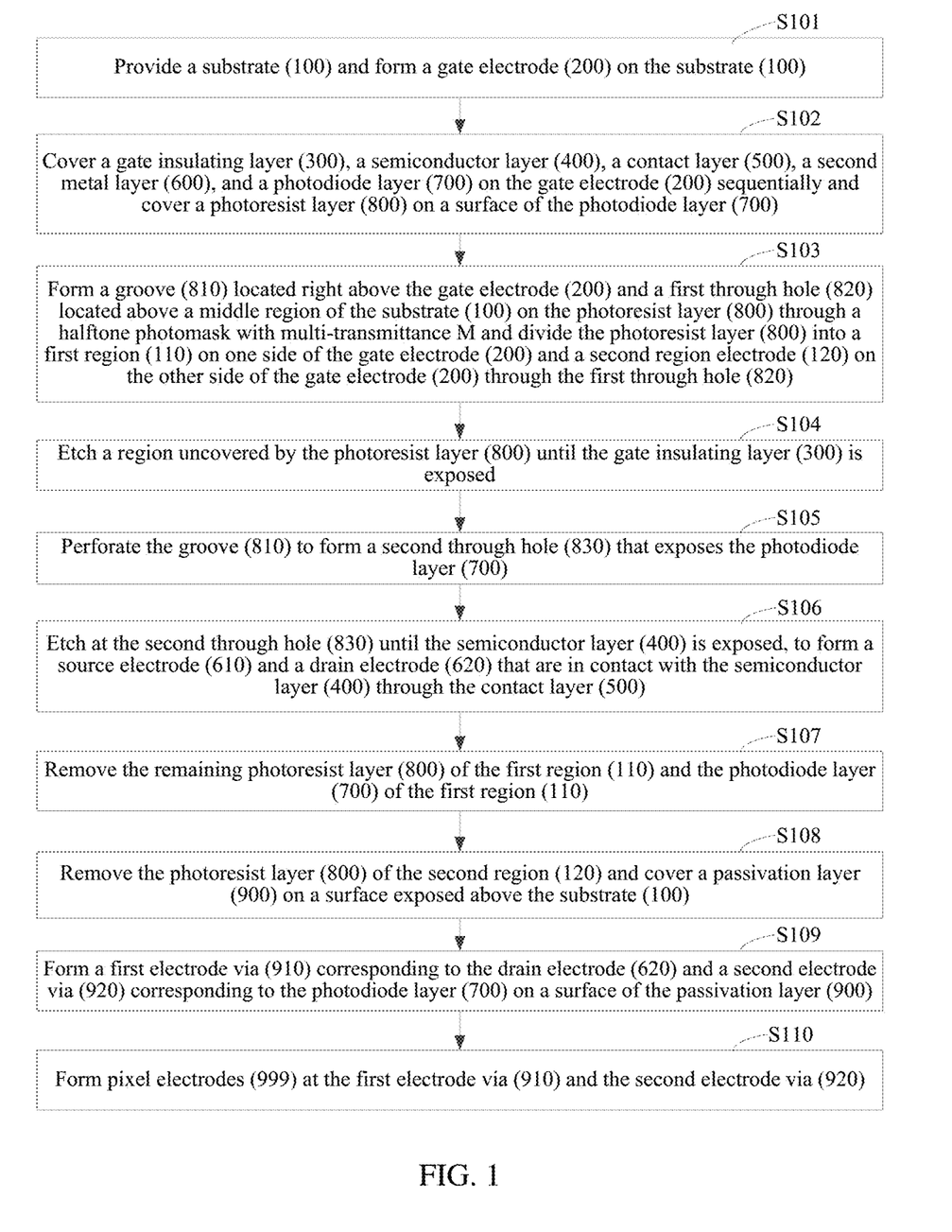
FIG. 1 is a schematic flowchart of a method for manufacturing a display panel according to an embodiment of the present application.

Referring to FIG. 1, FIG. 1 is a schematic flowchart of a method for manufacturing a display panel according to an embodiment of the present application. As shown in the figure, the method includes the following steps S101 to S110.

Figure 2:
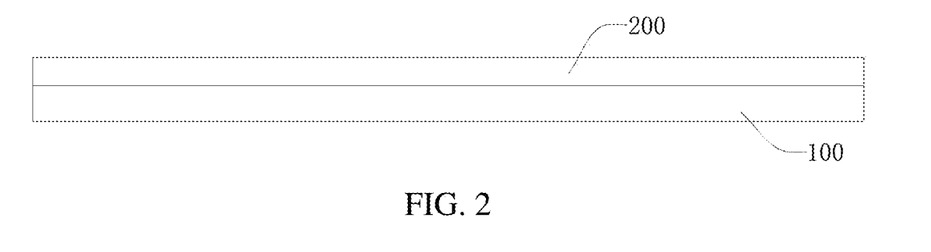
FIG. 2 is a schematic diagram of a first stage in step 101 of a method for manufacturing a display panel according to an embodiment of the present application.
Figure 3:
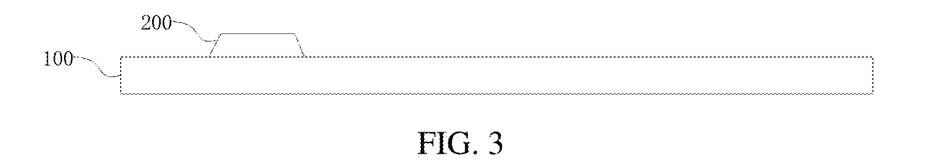
FIG. 3 is a schematic diagram of a second stage in step 101 of a method for manufacturing a display panel according to an embodiment of the present application.

Step S101: as shown in FIG. 2 and FIG. 3, provide a substrate 100 and form a gate electrode 200 on the substrate 100.

Specifically, at a first stage of step S101, as shown in FIG. 2, cover a first metal layer 20 on the substrate 100. At a second stage of step S101, as shown in FIG. 3, etch the first metal layer 20 through a first photomask (not shown in the figure) process to form the gate electrode 200.

Figure 4:
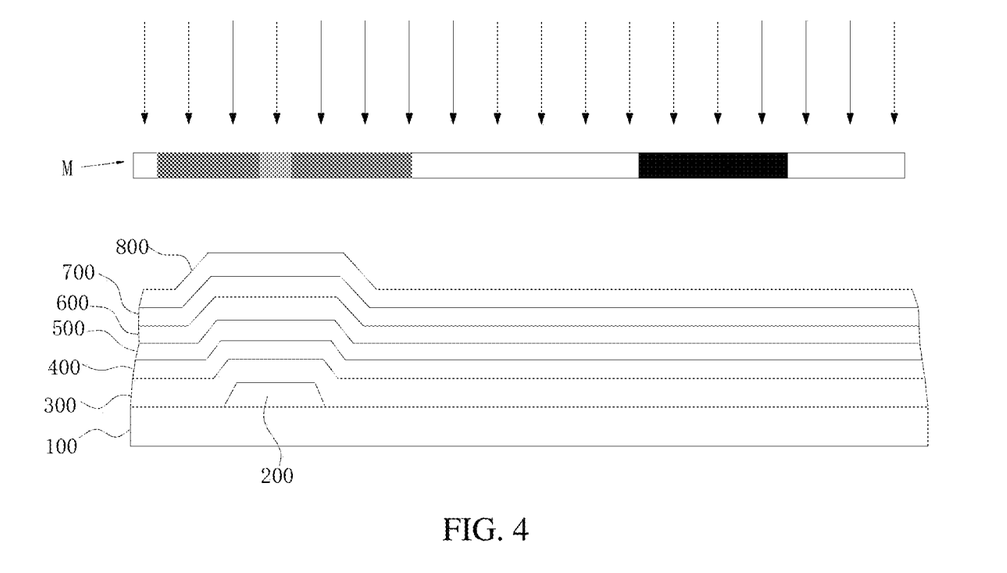
FIG. 4 is a schematic diagram of step 102 of a method for manufacturing a display panel and a corresponding halftone photomask with multi-transmittance according to an embodiment of the present application.

Step S102: as shown in FIG. 4, cover a gate insulating layer 300, a semiconductor layer 400, a contact layer 500, a second metal layer 600, and a photodiode layer 700 on the gate electrode 200 sequentially and cover a photoresist layer 800 on a surface of the photodiode layer 700.

Figure 5:
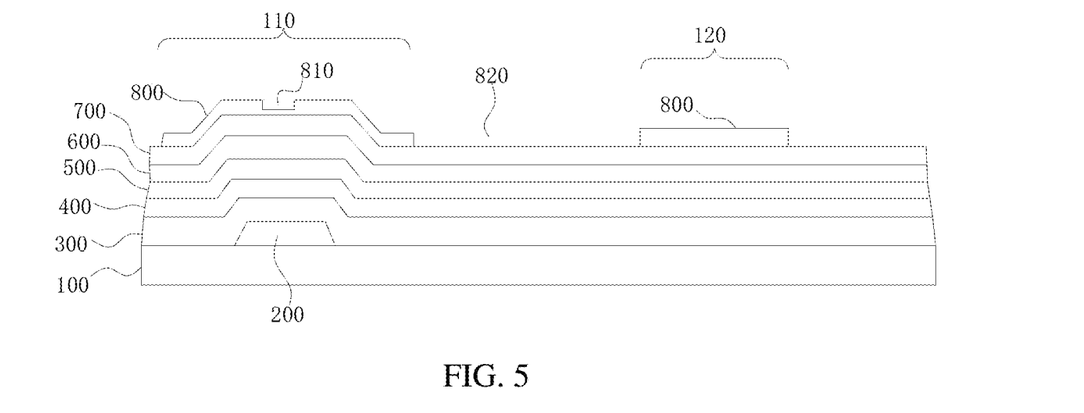
FIG. 5 is a schematic diagram of step 103 of a method for manufacturing a display panel according to an embodiment of the present application.

Step S103: as shown in FIG. 5, form a groove 810 located right above the gate electrode 200 and a first through hole 820 located above a middle region of the substrate 100 on the photoresist layer 800 through a halftone photomask with multi-transmittance M and divide the photoresist layer 800 into a first region 110 on one side of the gate electrode 200 and a second region 120 on the other side of the gate electrode 200 through the first through hole 820.

Figure 12:
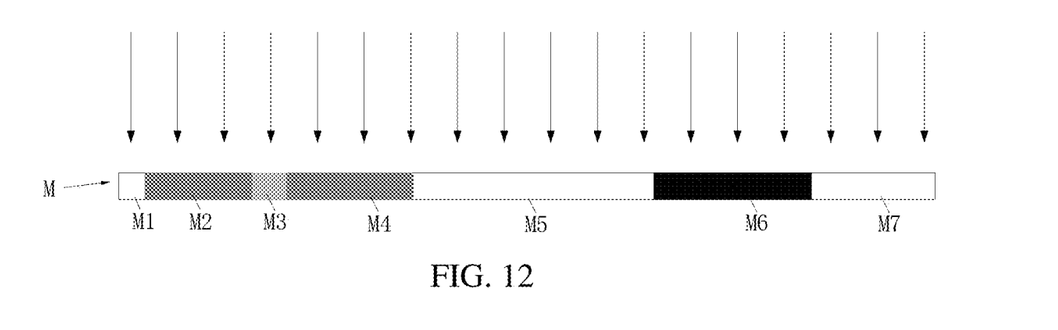
FIG. 12 is a schematic diagram of a halftone photomask with multi-transmittance of a display panel according to an embodiment of the present application.

Specifically, referring to FIG. 4 and FIG. 12, the halftone photomask with multi-transmittance M is divided into seven regions M1 to M7, and the seven regions are sequentially arranged according to a sequence from M1 to M7. The M1 region, the M5 region, the M7 region are totally transmissive. The M5 region is disposed at a middle position of the halftone photomask with multi-transmittance M and configured to form the first through hole 820 located above the middle region of the substrate 100. The M1 and M7 regions are respectively disposed on two sides of the halftone photomask with multi-transmittance M and configured to remove an edge portion of the photoresist layer 800 in a photomask processing.

The M2 region, the M3 region, and the M4 region are disposed between the M1 region and the M5 region. The M2 and M4 regions have certain transmittances and have the same transmittance. The transmittances of the M2 and M4 regions are smaller than a transmittance of the M3 region. The M2 region, the M3 region, and the M4 region correspond to the gate electrode 200, and the M3 region corresponds to a region right above the gate electrode 200. The M3 region and the M2 and M4 regions are configured to form the first region 110 on one side of the gate electrode 200 and the groove 810 located right above the gate electrode 200. A transmittance of the M6 region is zero and is configured to form the second region 120 on the other side of the gate electrode 200.

Specifically, when the first through hole 820 located above the middle region of the substrate 100 is formed, the edge portion of the photoresist layer 800 is removed, to form the first region 110 and the second region 120.

Figure 6:
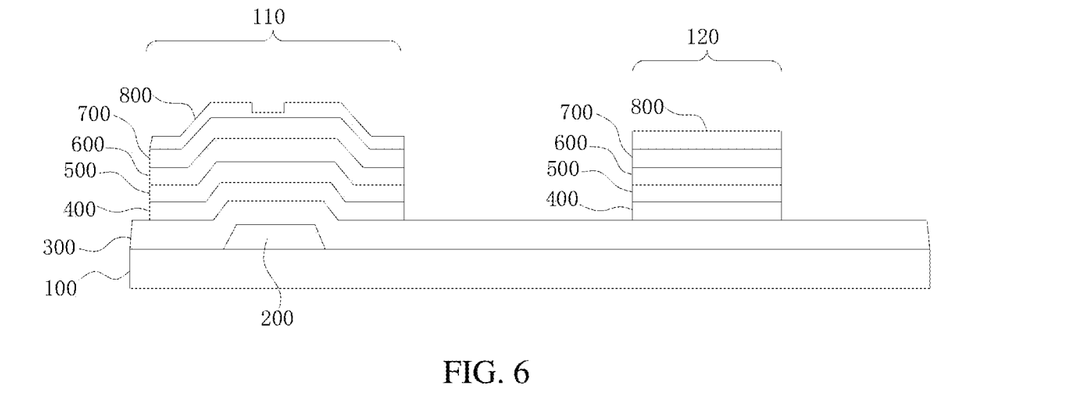
FIG. 6 is a schematic diagram of step 104 of a method for manufacturing a display panel according to an embodiment of the present application.

Step S104: as shown in FIG. 6, etch a region uncovered by the photoresist layer 800 until the gate insulating layer 300 is exposed.

Figure 7:
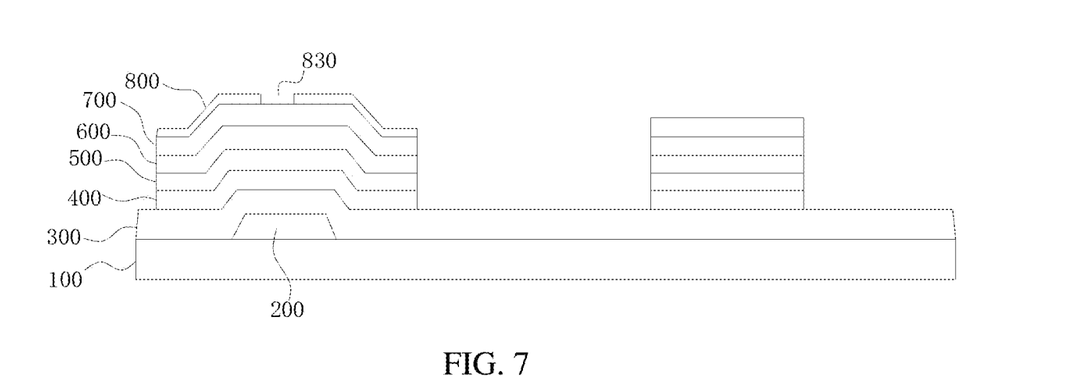
FIG. 7 is a schematic diagram of step 105 of a method for manufacturing a display panel according to an embodiment of the present application.

Step S105: as shown in FIG. 7, perforate the groove 810 to form a second through hole 830 that exposes the photodiode layer 700.

Specifically, the photoresist layer 800 on a surface of the first region 110 through the halftone photomask with multi-transmittance M is processed, so that the groove 810 is perforated to form the second through hole 830 that exposes the photodiode layer 700. In some embodiments, a photodiode of the photodiode layer 700 may be a P-I-N junction photodiode.

Figure 8:
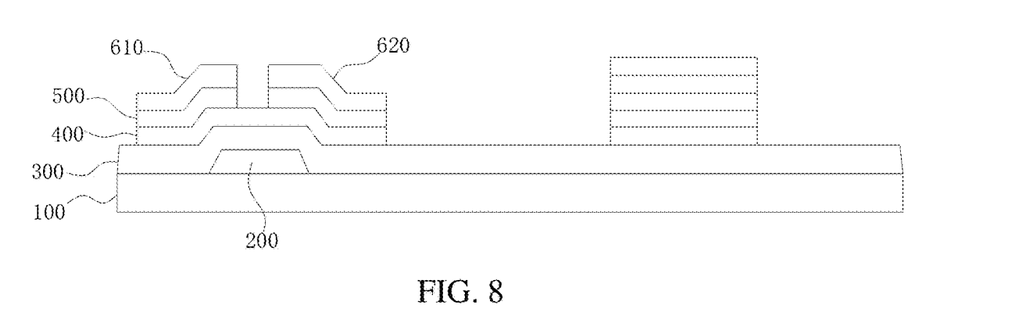
FIG. 8 is a schematic diagram of step 106 of a method for manufacturing a display panel according to an embodiment of the present application.

Step S106: as shown in FIG. 8, etch at the second through hole 830 until the semiconductor layer 400 is exposed, to form a source electrode 610 and a drain electrode 620 that are in contact with the semiconductor layer 400 through the contact layer 500.

Figure 9:
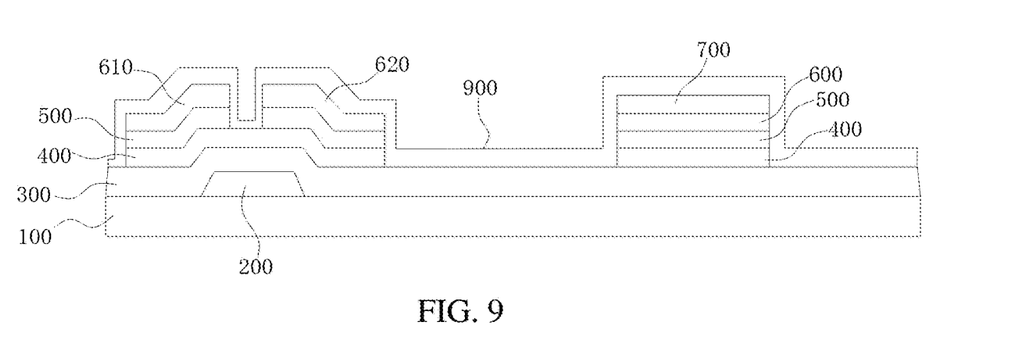
FIG. 9 is a schematic diagram of step 107 and step 108 of a method for manufacturing a display panel according to an embodiment of the present application.

Step S107: as shown in FIG. 9, remove the remaining photoresist layer 800 of the first region 110 and the photodiode layer 700 of the first region 110.

Step S108: as shown in FIG. 9, remove the photoresist layer 800 of the second region 120 and cover a passivation layer 900 on a surface exposed above the substrate 100.

Figure 10:
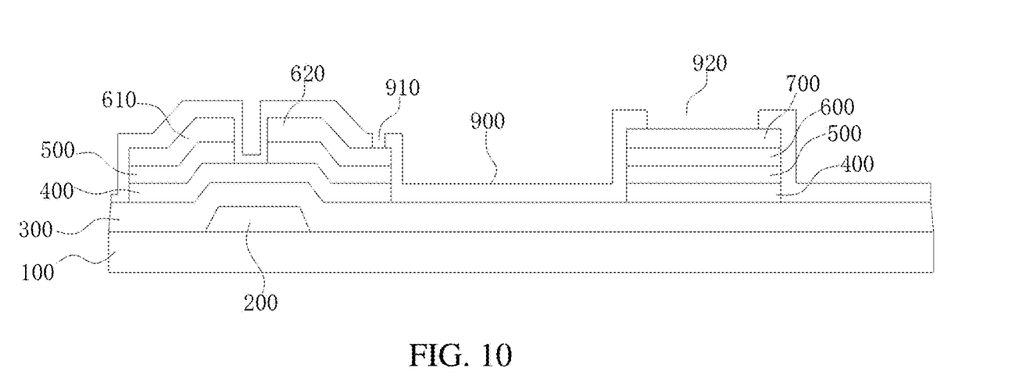
FIG. 10 is a schematic diagram of step 109 of a method for manufacturing a display panel according to an embodiment of the present application.

Step S109: as shown in FIG. 10, form a first electrode via 910 corresponding to the drain electrode 620 and a second electrode via 920 corresponding to the photodiode layer 700 on a surface of the passivation layer 900.

Specifically, etch a predetermined position of the passivation layer 900 through a third photomask (not shown in the figure) until the drain electrode 620 and the photodiode layer 700 are exposed, to form vias externally leading to the drain electrode 620 and the photodiode layer 700, that is, the first electrode via 910 corresponding to the drain electrode 620 and the second electrode via 920 corresponding to the photodiode layer 700.

Figure 11:
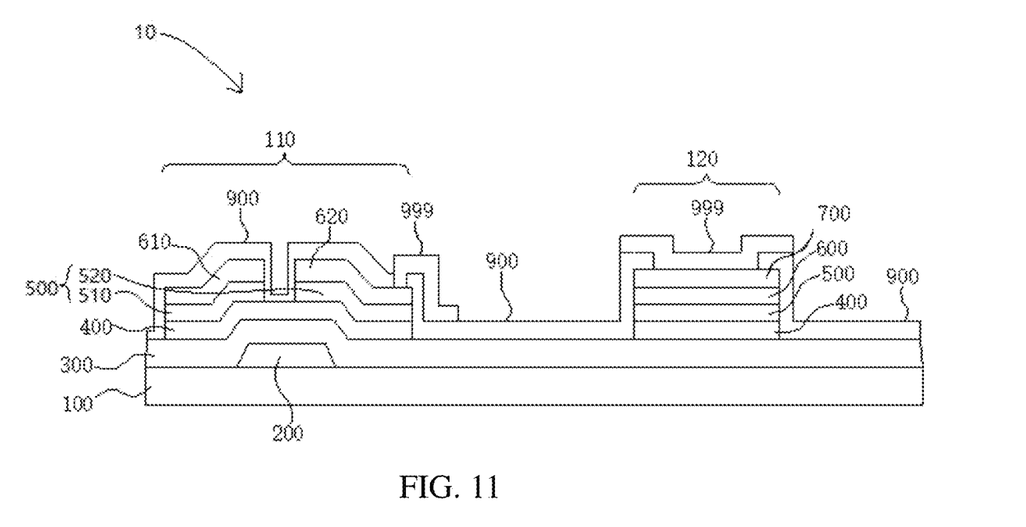
FIG. 11 is a schematic structural diagram of a display panel according to an embodiment of the present application.

Step S110: as shown in FIG. 11, form pixel electrodes 999 at the first electrode via 910 and the second electrode via 920.

Specifically, a transparent electrode layer (not shown in the figure) is covered on the surface of the passivation layer 900, and the transparent electrode layer (not shown in the figure) passes through the first electrode via 910 and the second electrode via 920 to respectively come into contact with the drain electrode 620 and the photodiode layer 700 and the transparent electrode layer is etched through a fourth photomask (not shown in the figure) to form the pixel electrodes 999.

Specifically, the photoresist layer 800 is divided into the first region 110 on one side of the gate electrode 200 and the second region 120 on the other side of the gate electrode 200 by using a halftone photomask with multi-transmittance M, and a photomask in a photodiode array processing is fused with a second photomask in a manufacturing processing of the display panel, thereby reducing the number of photomasks and reducing the processing costs.

Further, the transmittances of the halftone photomask with multi-transmittance M linearly change at each position at which regions having different transmittances are connected.

Specifically, as shown in FIG. 12, at the positions at which regions are connected, such as at a position at which the M2 and M3 regions are connected and the M2 region and the M3 region have different transmittances, using the transmittances that linearly change at the positions of connection enables an edge of an exposed photoresist layer pattern to present an inclined cross section having a narrower upper part and a wider lower part. In this way, when a material layer below the photoresist layer 800 is etched, a situation of a concave etched cross section that occurs may be compensated, and an edge of the photoresist layer of the inclined cross section has a compensation and protection effect on the etched cross section of the material layer.

Referring to FIG. 11, FIG. 11 shows a display panel 10 according to an embodiment of the present application. The display panel 10 includes a substrate 100, a gate electrode 200, a gate insulating layer 300, a semiconductor layer 400, a contact layer 500, a source electrode 610, a drain electrode 620, a second metal layer 600, a photodiode layer 700, a passivation layer 900, and pixel electrodes 999. The gate electrode 200 is located on a surface of the substrate 100. The gate insulating layer 300 covers the gate electrode 200. The semiconductor layer 400 is located on the gate insulating layer 300 and includes a first region semiconductor layer of a first region 110 located above the gate electrode 200 and a second region semiconductor layer of a second region 120 located spaced from the first region 110. The contact layer 500 is located on the semiconductor layer 400 of the first region 110 and the second region 120. The contact layer 500 of the first region 110 is divided into a source contact layer 510 in contact with an upper surface source electrode 610 and a drain contact layer 520 in contact with an upper surface drain electrode 620. The source electrode 610 and the drain electrode 620 are in contact with the semiconductor layer 400 respectively through the source electrode contact layer 510 and the drain electrode contact layer 520. The second metal layer 600 and the photodiode layer 700 sequentially cover above the contact layer 500 of the second region 120. The passivation layer 900 covers all exposed surfaces above the substrate 100. A surface of the passivation layer 900 is provided with vias leading to the drain electrode 620 and the photodiode layer 700. The pixel electrodes 999 cover the surface of the passivation layer 900 and are connected to the drain electrode 620 and the photodiode layer 700 through the vias. The source electrode 610, the drain electrode 620, and the photodiode layer 700 are formed through a halftone photomask with multi-transmittance M.

Specifically, the photoresist layer 800 is divided into the first region on one side of the gate electrode and the second region on the other side of the gate electrode by using a halftone photomask with multi-transmittance M, and a photomask in a photodiode array processing is fused with a second photomask in a manufacturing processing of the display panel 10, thereby reducing the number of photomasks and reducing process costs.

Further, transmittances of the halftone photomask with multi-transmittance M linearly change at each position at which regions having different transmittances are connected.

Specifically, as shown in FIG. 12, at the positions at which regions are connected, such as at a position at which the M2 and M3 regions are connected and the M2 region and the M3 region have different transmittances, using the transmittances that linearly change at the positions of connection enables an edge of an exposed photoresist layer pattern to present an inclined cross section having a narrower upper part and a wider lower part. In this way, when a material layer below the photoresist layer is etched, a situation of a concave etched cross section that occurs may be compensated, and an edge of a photoresist layer of the inclined cross section has a compensation and protection effect on the etched cross section of the material layer.

Specifically, referring to FIG. 10, the via that provided on the surface of the passivation layer 900 and that leads to the drain electrode 620 is the first electrode via 910, and the via that leads to the photodiode layer 700 is the second electrode via 920.

Specifically, a photodiode of the photodiode layer 700 may be a P-I-N junction photodiode.

In the several embodiments provided by the present application, it should be understood that the disclosed method are merely illustrative and may be implemented in other manners.

It should be noted that the steps in the embodiments of the present application may be sequentially adjusted, combined, or deleted according to actual requirements.

The foregoing descriptions are merely specific embodiments of the present application, but are not intended to limit the protection scope of the present application. Any modification or replacement readily figured out by persons skilled in the art within the technical scope disclosed in the present application shall fall within the protection scope of the present application. Therefore, the protection scope of the present application shall be subject to the appended claims.

What is claimed is:

1. A method for manufacturing a display panel, comprising:

providing a substrate and forming a gate electrode on the substrate;

forming a gate insulating layer, a semiconductor layer, a contact layer, a second metal layer, and a photodiode layer on the gate electrode sequentially and forming a photoresist layer on a surface of the photodiode layer;

forming a groove located right above the gate electrode and a first through hole located above a middle region of the substrate on the photoresist layer through a halftone photomask with multi-transmittance M and dividing the photoresist layer into a first region on one side of the gate electrode and a second region on the other side of the gate electrode through the first through hole;

etching a region uncovered by the photoresist layer until the gate insulating layer is exposed;

perforating the groove to form a second through hole that exposes the photodiode layer;

etching at the second through hole until the semiconductor layer is exposed, to form a source electrode and a drain electrode that are in contact with the semiconductor layer through the contact layer;

removing the remaining photoresist layer of the first region and the photodiode layer of the first region;

removing the photoresist layer of the second region and forming a passivation layer on a surface exposed above the substrate;

forming a first electrode via corresponding to the drain electrode and a second electrode via corresponding to the photodiode layer on a surface of the passivation layer; and forming pixel electrodes at the first electrode via and the second electrode via.

2. The method for manufacturing a display panel according to claim 1, wherein the providing a substrate and forming a gate electrode on the substrate comprises: forming a first metal layer on the substrate and etching the first metal layer through a first photomask to form the gate electrode.

3. The method for manufacturing a display panel according to claim 1, wherein the perforating the groove to form a second through hole that exposes the photodiode layer comprises:

processing the photoresist layer on a surface of the first region through the halftone photomask with multi-transmittance M, so that the groove is perforated to form the second through hole that exposes the photodiode layer.

4. The method for manufacturing a display panel according to claim 1, wherein the forming a groove located right above the gate electrode and a first through hole located above a middle region of the substrate on the photoresist layer through a halftone photomask with multi-transmittance M comprises:
removing an edge portion of the photoresist layer.

5. The method for manufacturing a display panel according to claim 4, wherein the halftone photomask with multi-transmittance M is divided into seven regions M1 to M7, and the M1 region and the M7 region are totally transmissive, respectively disposed at two ends of the halftone photomask with multi-transmittance M, and configured to remove the edge portion of the photoresist layer.

6. The method for manufacturing a display panel according to claim 5, wherein the halftone photomask with multi-transmittance M comprises the M5 region located at a middle position, and the M5 region is totally transmissive and is configured to form the first through hole located above the middle region of the substrate.

7. The method for manufacturing a display panel according to claim 6, wherein the halftone photomask with multi-transmittance M comprises the M2 region, the M3 region, and the M4 region that are disposed between the M1 region and the M5 region, the M2 region, the M3 region, and the M4 region have certain transmittances, and the M2 region, the M3 region, and the M4 region correspond to the gate electrode and are configured to form the first region.

8. The method for manufacturing a display panel according to claim 7, wherein the M3 region corresponds to a region right above the gate electrode, the M2 region and the M4 region are disposed on two sides of the M3 region, a transmittance of the M3 region is greater than transmittances of the M2 region and the M4 region, and the M3 region is configured to form the groove located right above the gate electrode.

9. The method for manufacturing a display panel according to claim 8, wherein a transmittance of the M2 region is the same as that of the M4 region.

10. The method for manufacturing a display panel according to claim 6, wherein the halftone photomask with multi-transmittance M further comprises the M6 region disposed between the M5 region and the M7 region, a transmittance of the M6 region is zero and the M6 region is configured to form the second region located on the other side of the gate electrode.

11. The method for manufacturing a display panel according to claim 1, wherein a photodiode of the photodiode layer is a P-I-N junction photodiode.

12. The method for manufacturing a display panel according to claim 1, wherein the forming a first electrode via corresponding to the drain electrode and a second electrode via corresponding to the photodiode layer on a surface of the passivation layer comprises:
etching a predetermined position of the passivation layer through a third photomask until the drain electrode and the photodiode layer are exposed, to form vias externally leading to the drain electrode and the photodiode layer.

13. The method for manufacturing a display panel according to claim 1, wherein the forming a pixel electrode at the first electrode via and the second electrode via comprises:
forming, on the surface of the passivation layer, a transparent electrode layer that passes through the first electrode via and the second electrode via to respectively come into contact with the drain electrode and the photodiode layer and etching the transparent electrode layer through a fourth photomask to form the pixel electrode.

14. The method for manufacturing a display panel according to claim 1, wherein transmittances of the halftone photomask with multi-transmittance M linearly change at each position at which regions having different transmittances are connected.

15. A method for manufacturing a display panel, comprising:
forming a first metal layer on a substrate and etching the first metal layer through a first photomask to form a gate electrode;
forming a gate insulating layer, a semiconductor layer, a contact layer, a second metal layer, and a photodiode layer on the gate electrode sequentially and forming a photoresist layer on a surface of the photodiode layer;
forming a groove located right above the gate electrode and a first through hole located above a middle region of the substrate on the photoresist layer through a halftone photomask with multi-transmittance M, removing an edge portion of the photoresist layer, and dividing the photoresist layer into a first region on one side of the gate electrode and a second region on the other side of the gate electrode through the first through hole;
etching a region uncovered by the photoresist layer until the gate insulating layer is exposed;
processing the photoresist layer on a surface of the first region through the halftone photomask with multi-transmittance M, so that the groove is perforated to form a second through hole that exposes the photodiode layer;
etching at the second through hole until the semiconductor layer is exposed, to form a source electrode and a drain electrode that are in contact with the semiconductor layer through the contact layer;
removing the remaining photoresist layer of the first region and the photodiode layer of the first region;
removing the photoresist layer of the second region and forming a passivation layer on a surface exposed above the substrate;
forming a first electrode via corresponding to the drain electrode and a second electrode via corresponding to the photodiode layer on a surface of the passivation layer; and
forming, on the surface of the passivation layer, a transparent electrode layer that passes through the first electrode via and the second electrode via to respectively come into contact with the drain electrode and the photodiode layer and etching the transparent electrode layer through a fourth photomask to form pixel electrodes, wherein
transmittances of the halftone photomask with multi-transmittance M linearly change at each position at which regions having different transmittances are connected.

16. The method for manufacturing a display panel according to claim 15, wherein the halftone photomask with multi-transmittance M is divided into seven regions M1 to M7, the seven regions are sequentially arranged according to a sequence from M1 to M7, the M1 region and the M5 region are totally transmissive, the M2 region, the M3 region, and the M4 region have certain transmittances, a transmittance of the M3 region is greater than transmittances of the M2 region and the M4 region, a transmittance of the M2 region is the same as that of the M4 region, and a transmittance of the M6 region is zero.

17. A display panel, comprising:
a substrate;

a gate electrode, located on a surface of the substrate, wherein a gate insulating layer is formed above the gate electrode;

a semiconductor layer, located on the gate insulating layer and comprising a first region semiconductor layer of a first region located above the gate electrode and a second region semiconductor layer of a second region located spaced from the first region;

a contact layer, located on the semiconductor layer of the first region and the second region, wherein a contact layer of the first region is divided into a source contact layer in contact with an upper surface source electrode and a drain contact layer in contact with an upper surface drain electrode, the source electrode and the drain electrode are in contact with the semiconductor layer respectively through the source contact layer and the drain contact layer, and a second metal layer and a photodiode layer are sequentially formed above a contact layer of the second region;

a passivation layer, forming on a surface exposed above the substrate, wherein a surface of the passivation layer is provided with vias leading to the drain electrode and the photodiode layer; and pixel electrodes, forming on the surface of the passivation layer and connected to the drain electrode and the photodiode layer through the vias.

18. The display panel according to claim 17, wherein the source electrode, the drain electrode, and the photodiode layer are formed through a halftone photomask with multi-transmittance M.

19. The display panel according to claim 18, wherein transmittances of the halftone photomask with multi-transmittance M linearly change at each position at which regions having different transmittances are connected.

20. The display panel according to claim 17, wherein a photodiode of the photodiode layer is a P-I-N junction photodiode.

* * * * *